United States Patent
Yoshitake et al.

(10) Patent No.: US 10,853,959 B2
(45) Date of Patent: Dec. 1, 2020

(54) OPTICAL INSPECTION TOOL AND METHOD

(71) Applicant: SANDISK TECHNOLOGIES LLC, Addison, TX (US)

(72) Inventors: Yasuhiro Yoshitake, Yokohama (JP); Taiki Murata, Yokkaichi (JP); Satoshi Shigematsu, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/371,290

(22) Filed: Apr. 1, 2019

(65) Prior Publication Data

US 2020/0311955 A1    Oct. 1, 2020

(51) Int. Cl.
| | |
|---|---|
| *G06T 7/557* | (2017.01) |
| *H01L 21/66* | (2006.01) |
| *G06T 7/00* | (2017.01) |
| *H04N 5/225* | (2006.01) |
| *H01L 27/11556* | (2017.01) |
| *H01L 27/11582* | (2017.01) |

(Continued)

(52) U.S. Cl.
CPC ............ *G06T 7/557* (2017.01); *G06T 7/0004* (2013.01); *H01L 22/12* (2013.01); *H04N 5/22541* (2018.08); *G06T 2207/10028* (2013.01); *G06T 2207/10052* (2013.01); *G06T 2207/20221* (2013.01); *G06T 2207/20224* (2013.01); *G06T 2207/30148* (2013.01); *H01L 27/11519* (2013.01); *H01L 27/11556* (2013.01); *H01L 27/11565* (2013.01); *H01L 27/11582* (2013.01)

(58) Field of Classification Search
CPC ............ G06T 7/557; G06T 7/0004; G06T 2207/10052; G06T 2207/20224; G06T 2207/10028; G06T 2207/20221; G06T 2207/30148; H04N 5/22541; H01L 22/12; H01L 27/11582; H01L 27/11556; H01L 27/11519; H01L 27/11565
See application file for complete search history.

(56) References Cited

U.S. PATENT DOCUMENTS

| | | | |
|---|---|---|---|
| 9,589,981 B2 | 3/2017 | Nishikawa et al. | |
| 9,646,981 B2 | 5/2017 | Nishikawa et al. | |
| 10,080,011 B1* | 9/2018 | Periasamy | ......... H04N 5/22541 |

(Continued)

FOREIGN PATENT DOCUMENTS

| | | |
|---|---|---|
| WO | WO2009/051466 A1 | 4/2009 |
| WO | WO2019/001877 A1 | 1/2019 |

OTHER PUBLICATIONS

Ren Ng, "Digital Light Field Photography" a dissertation, Department of Computer Science, Stanford University, Jul. 2006, 203 pages.

(Continued)

*Primary Examiner* — Nasim N Nirjhar
(74) *Attorney, Agent, or Firm* — The Marbury Law Group, PLLC

(57) ABSTRACT

A method of inspecting a device under test for defects includes detecting intensity and directional information of radiation rays emanating from a device under test by a light field camera, generating synthesized images of the device under test detected by the light field camera, and determining a depth of a defect in the device under test from the synthesized images.

3 Claims, 12 Drawing Sheets

(51) Int. Cl.
    *H01L 27/11565*   (2017.01)
    *H01L 27/11519*   (2017.01)

(56) References Cited

U.S. PATENT DOCUMENTS

| | | | |
|---|---|---|---|
| 10,115,681 | B1 | 10/2018 | Ariyoshi |
| 10,209,636 | B1 | 2/2019 | Toda et al. |
| 2002/0089583 | A1 | 7/2002 | You et al. |
| 2005/0199808 | A1 | 9/2005 | Obara et al. |
| 2014/0139830 | A1* | 5/2014 | Lange ................ G01N 21/9501 356/237.5 |
| 2014/0253760 | A1* | 9/2014 | Watanabe ............... H04N 5/142 348/239 |
| 2016/0063691 | A1* | 3/2016 | Whipple ................ G06T 7/0004 382/141 |
| 2018/0115770 | A1* | 4/2018 | Salahieh ............. H04N 13/305 |

OTHER PUBLICATIONS

U.S. Appl. No. 16/231,752, filed Dec. 24, 2018, SanDisk Technologies LLC.

* cited by examiner

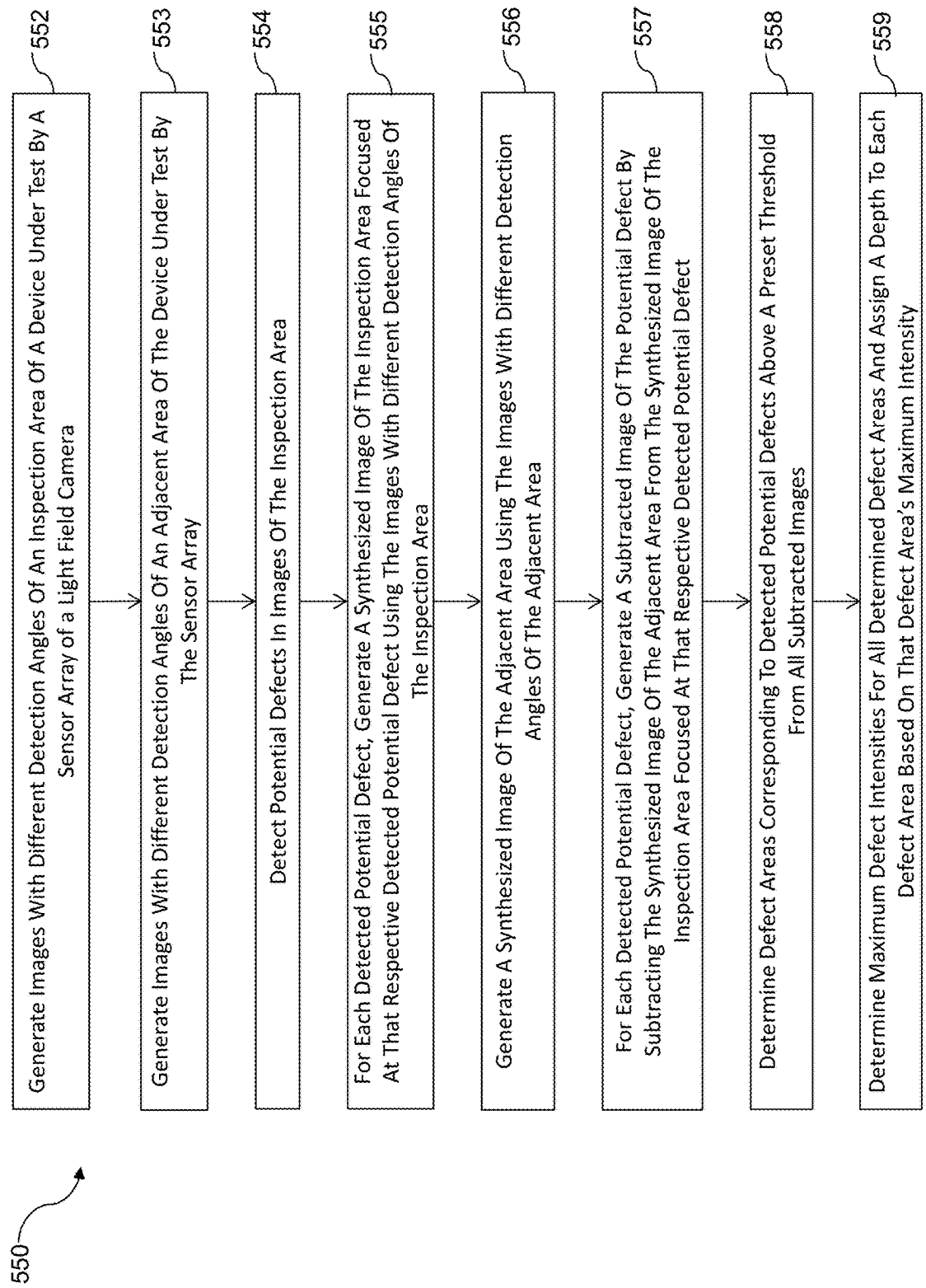

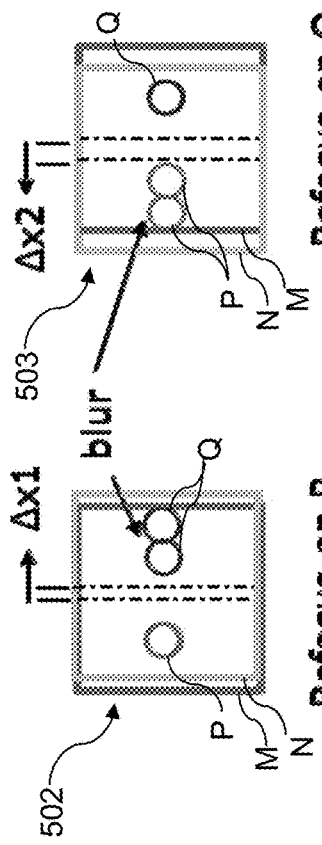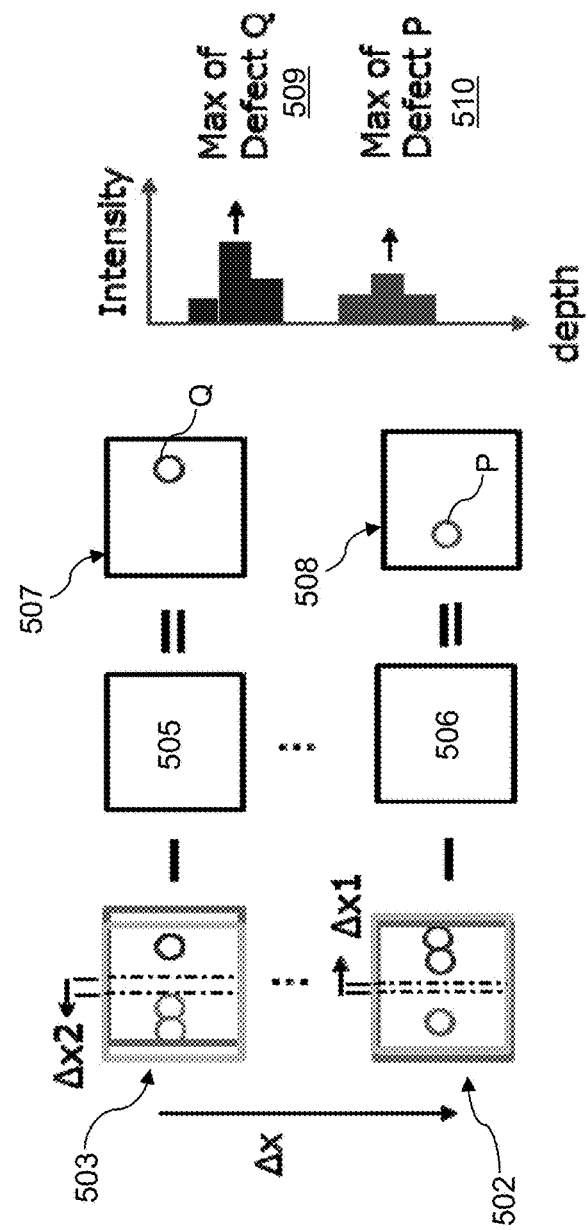

OPTICAL INSPECTION TOOL AND METHOD

FIELD

The present disclosure relates generally to optical inspection tools and methods, and more particularly to tools and methods for wafer defect detection using a light field camera to produce synthesized images.

BACKGROUND

Continued device scaling of semiconductor devices is leading to many layers being stratified in the semiconductor devices. As semiconductor devices are becoming more complex, the detection of defects in the manufacturing processes is becoming more complex.

SUMMARY

According to one embodiment, a method of inspecting a device under test for defects includes detecting intensity and directional information of radiation rays emanating from a device under test by a light field camera, generating synthesized images of the device under test detected by the light field camera, and determining a depth of a defect in the device under test from the synthesized images.

According to another embodiment, an optical inspection tool comprises a stage configured to support a device under test on its upper surface and to move the supported device under test in a plane parallel to the upper surface, a light field camera, and an imaging controller connected wirelessly or by a wire to the stage and the light field camera. The imaging controller is configured to generate synthesized images of the device under test detected by the light field camera, and determine a depth of a defect in the device under test from the synthesized images.

BRIEF DESCRIPTION OF THE DRAWINGS

FIGS. 5A and 5B are process flow diagrams illustrating methods of inspecting a device under test for defects based at least in part on synthesized images according to embodiments of the present disclosure.

FIG. 6A is block diagram illustrating operations to shift two images with different detection angles to generate a synthesized image.

FIG. 6B is block diagram illustrating operations to shift two images with different detection angles to generate another synthesized image.

FIG. 6C is a block diagram illustrating operations to detect defects based at least in part on synthesized images.

DETAILED DESCRIPTION

Figure 1A:
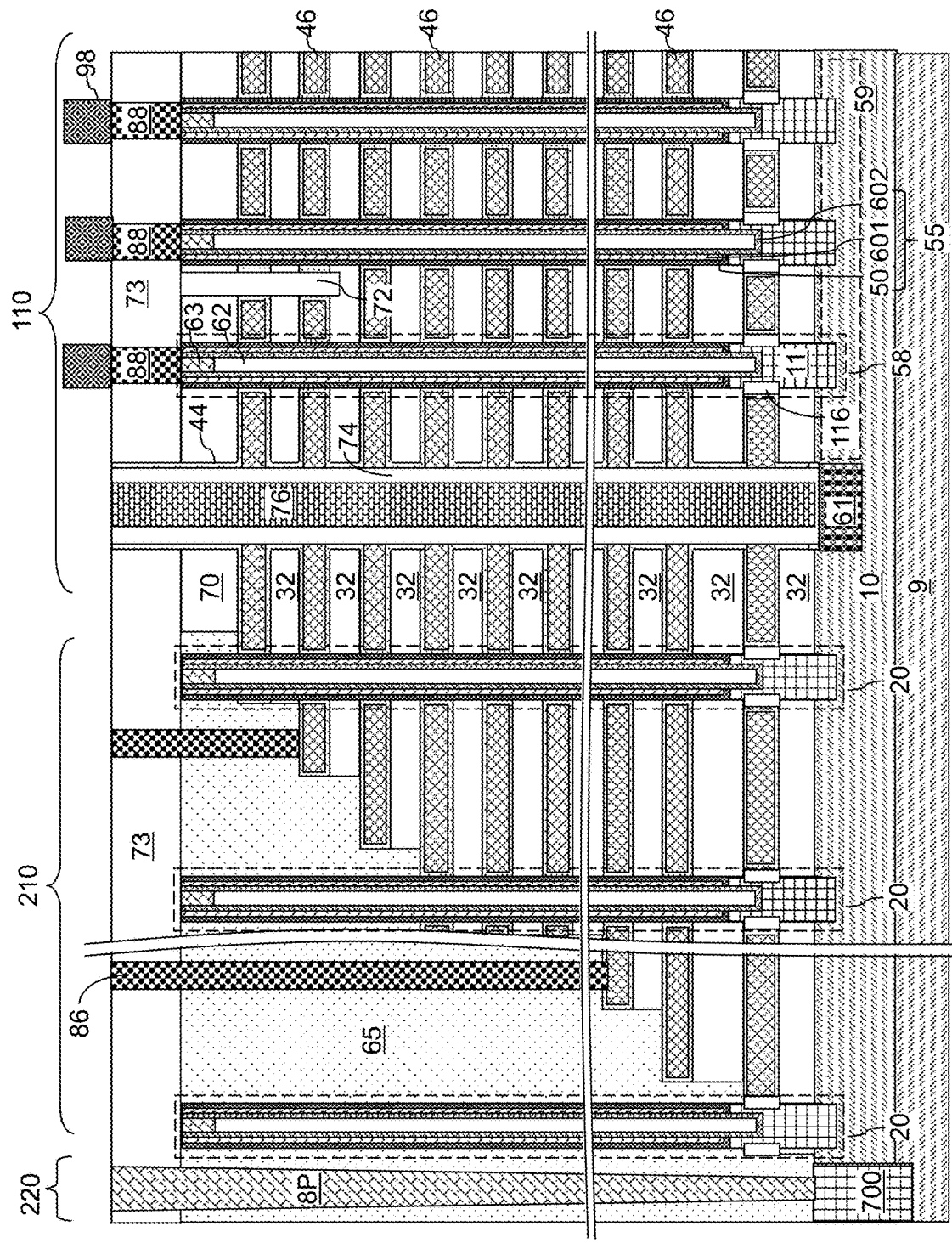
FIG. 1A is a schematic vertical cross-sectional view of an exemplary three-dimensional memory device including a three-dimensional memory array according to an embodiment of the present disclosure.

The detection of defects at different depths from a substrate in a semiconductor device, such as in vertical memory holes of three dimensional NAND memory devices or in other vertically extending features in other devices is growing both more difficult and more important to semiconductor or other solid state device manufacturing. In three dimensional memory devices, such as three dimensional NAND memory devices containing vertical channels, the memory holes (i.e., memory openings) extending through a stack of word lines/control gate electrodes and containing the vertical channels and memory films (e.g., charge storage layer or floating gates located between tunneling and blocking dielectrics) are getting deeper due to the increased number of word lines/control gate electrodes that are stacked over the substrate. Detecting and locating defects in semiconductor and other solid state devices during the manufacturing process can help avoid device failure. Accordingly, information associated with defects, such as the defect depth position, is helpful to assist in manufacturing process feedback. In order to obtain depth information, after wafer inspection, defects are conventionally reviewed by varying focus positions and finding the maximum intensities which would indicate the positions where defects are in depth. However this procedure can take up to 15 hours for finding 300 defects.

The embodiments of the present disclosure may permits skipping such lengthy defect reviews involving varying focus positions to find maximum intensities. Some embodiments of the present disclosure are directed to inspection tools and inspection methods that provide defect depth measurement using a light field camera without requiring varying focus positions of lens or cameras. The embodiments may include detecting intensity and directional information of radiation rays emanating from a device under test by a light field camera, generating synthesized images of the device under test detected by a light field camera, and determining a depth of a defect in the device under test from the synthesized images. The inspection tools and methods may be used to inspect any solid state micro-scale or nano-scale device under test, such as a semiconductor device located on a semiconductor wafer or another substrate or other solid state devices, such as hard disk drive heads, etc.

Some embodiments of the present disclosure are directed to optical inspection tools and methods that detect depths of defects in a device under test based at least in part on images generated by shifting parallax images. The embodiments of the present disclosure may provide a defect depth measurement procedure that includes the generation of synthesized images in which parallax images are shifted by an amount corresponding to a depth position and superimposed over one another. The embodiment depth measurement procedure may include subtracting the synthesized image of an adjacent area from the synthesized image of an inspection area of the device under test, finding the maximum intensity from the subtracted synthesized images, and assigning depth positions to defects from the maximum intensity determined from the shifted values used to generate the synthesized images.

The embodiments of the present disclosure may provide an optical inspection tool including multiple sensor arrays which are aligned so that the sensor arrays are shifted by a sub pixel length. The inspection tool may include an image capture system which synchronizes the said sensor arrays and a translation stage on which the device under test may be supported. The inspection tool may include an image synthesis system which generates super resolution images from the images obtained with the image capture system. The inspection tool may include lens arrays installed between a detection lens (e.g., an objective lens) and the sensor arrays. The combination of lens arrays and multiple sensors shifted (e.g., offset) from one another by a sub-pixel distance may give the inspection tool sub-pixel resolution.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The inspection tool and method may be used to inspect various solid state devices, such as various three-dimensional memory devices, including a monolithic or a non-monolithic three-dimensional NAND string memory device that can be fabricated employing the various embodiments described herein.

Generally, a semiconductor package can include a memory chip. Each semiconductor package contains one or more memory dies (for example one, two, or four). The die is the smallest unit that can independently execute commands or report status. Each die contains one or more planes (typically one to four planes). Identical, concurrent operations can take place on each plane, although with some restrictions. Each plane contains a number of blocks, which are the smallest unit that can be erased by in a single erase operation. Each block contains a number of pages, which is the smallest unit on which a read operation can be performed.

Figure 1B:
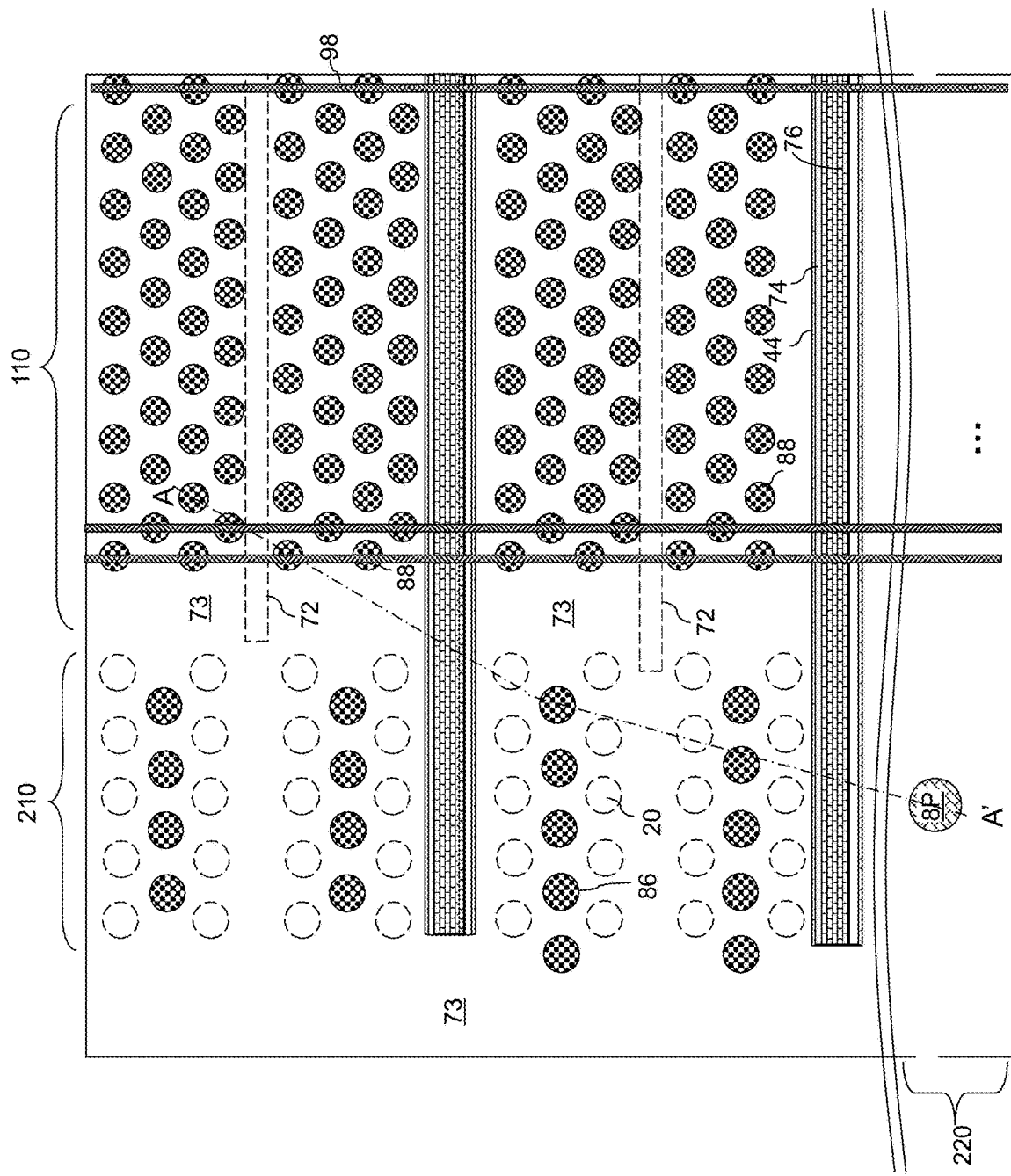
FIG. 1B is a top-down view of the exemplary three-dimensional memory device of FIG. 1A.

A non-limiting example of a three-dimensional memory device that can be included in a semiconductor die is illustrated in FIGS. 1A and 1B. While the three-dimensional memory device illustrated in FIGS. 1A and 1B include vertical NAND memory devices, the memory devices that can be employed for the semiconductor chips employed in the chip assembly structures of the present disclosure include other memory devices such as two-dimensional NAND memory devices, NOR memory devices, SRAM's, DRAM's, ReRAM memory devices, spin torque memory devices, or any other memory device that can be packaged in a semiconductor chip. Further, semiconductor chips including logic devices, such as a processor chip, can be employed for the chip assembly structures of the embodiments present disclosure.

The three-dimensional NAND memory device illustrated in FIGS. 1A and 1B includes a substrate (9, 10), which can be a semiconductor substrate. The substrate (9, 10) can include a substrate semiconductor layer 9 such as a semiconductor wafer, for example a silicon wafer, and an optional semiconductor material layer 10 that is formed on the substrate semiconductor layer 9. Semiconductor devices 700 such as field effect transistors can be formed on the semiconductor substrate to provide a peripheral circuit (e.g., driver circuit) for controlling operation of the three-dimensional memory devices provided in the memory array region (e.g., memory plane) 110. The peripheral circuit can include a sense amplifier circuitry electrically connected to bit lines 98 that laterally extend into the memory array region 110. The region of the semiconductor devices 700 is referred to as a peripheral device region 220. Alternatively, the semiconductor devices 700 of the peripheral circuit can be formed on a separate substrate (e.g., separate silicon wafer) and then bonded to the memory die containing the memory array region 110. An alternating stack of insulating layers 32 and spacer material layers are formed over the substrate (9, 10). The spacer material layers are formed as, or are subsequently replaced with, electrically conductive layers 46. An insulating cap layer 70 can be formed over the alternating stack (32, 46). The middle electrically conductive layers 46 comprise word lines/control gate electrodes of the NAND memory devices. At least one upper and lower electrically conductive layer 46 comprises a respective drain and source select gate electrode.

A staircase region can be formed in the contact region 210 by patterning the alternating stack (32, 46) such that underlying layers extend farther than overlying layers. A retro-stepped dielectric material portion 65 can be formed over the stepped surfaces of the alternating stack (32, 46) in the staircase region. Memory holes (i.e., memory openings) can be formed in the memory array region 110 and support openings can be formed in the contact region 210 by an anisotropic etch employing an etch mask layer. Memory opening fill structures 58 can be formed in each memory opening, and support pillar structures 20 can be formed in each support opening. The memory opening fill structures 58 and the support pillar structures 20 can include a same set of structural elements have a same composition. For example, each of the memory opening fill structures 58 and the support pillar structures 20 can include a pedestal channel portion 11, a memory stack structure 55, an optional dielectric core 62, and a drain region 63. Each memory stack structure 55 can include a memory film 50 and a semiconductor channel 60. Each memory film 50 can include a layer stack of, from outside to inside, an optional blocking dielectric layer, a vertical stack of memory elements (which may comprise, for example, as portions of a silicon nitride charge storage material layer or floating gates located at levels of the electrically conductive layers 46), and a tunneling dielectric layer. Each semiconductor channel 60 can include a first semiconductor channel layer 601 and a second semiconductor channel layer 602.

A contact level dielectric layer 73 can be formed over the alternating stack (32, 46). If the spacer material layers are provided as sacrificial material layers, backside trenches can be formed between groups of memory opening fill structures 58 to facilitate replacement of the sacrificial material layers with electrically conductive layers 46. Backside recesses can be formed by introducing into the backside trenches an isotropic etchant that etches the material of the sacrificial material layers (e.g., silicon nitride or polysilicon layers) selective to the insulating layers 32 (e.g., silicon oxide layers), the memory opening fill structures 58, and the support pillar structures 20. Removal of the sacrificial material layers forms backside recesses that laterally surround the memory opening fill structures 58 and the support pillar structures 20. Tubular insulating spacers 116 can be formed around the pedestal channel portions 11, for example, by oxidation of the semiconductor material of the pedestal channel portions 11. Optional backside blocking dielectric layers 44 and the electrically conductive layers 46 can be formed in the backside recesses.

Source regions 61 can be formed in the semiconductor material layer 10 underneath the backside trenches, for example, by ion implantation. Surface regions of the semiconductor material layer 10 between the pedestal channel portions 11 and the source regions 61 constitute horizontal semiconductor channels 59. Insulating spacers 74 and backside contact via structures 76 (e.g., source electrode or source local interconnect) can be formed in the backside trenches. Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73 and the retro-stepped dielectric material portion 65 in the contact region 210 (e.g., in the word line electrically hook up region). Peripheral device contact via structures 8P can be formed through the contact level dielectric layer 73 and the retro-stepped dielectric material portion 65 in the peripheral device region 220 in electrical contact with respective nodes (e.g., sources, drains and/or gate electrodes) of the peripheral devices 700. An additional interconnect level dielectric material layer (not shown) and additional metal interconnect structures (not shown) can be formed. The bit lines 98 are located in the additional interconnect level dielectric material layer, extend in the bit line direction (e.g., x-direction) and electrically contact the drain contact via structures 88. The electrically conductive layers (e.g., word lines) 46 extend in the perpendicular word line direction (e.g., y-direction).

Figure 2:
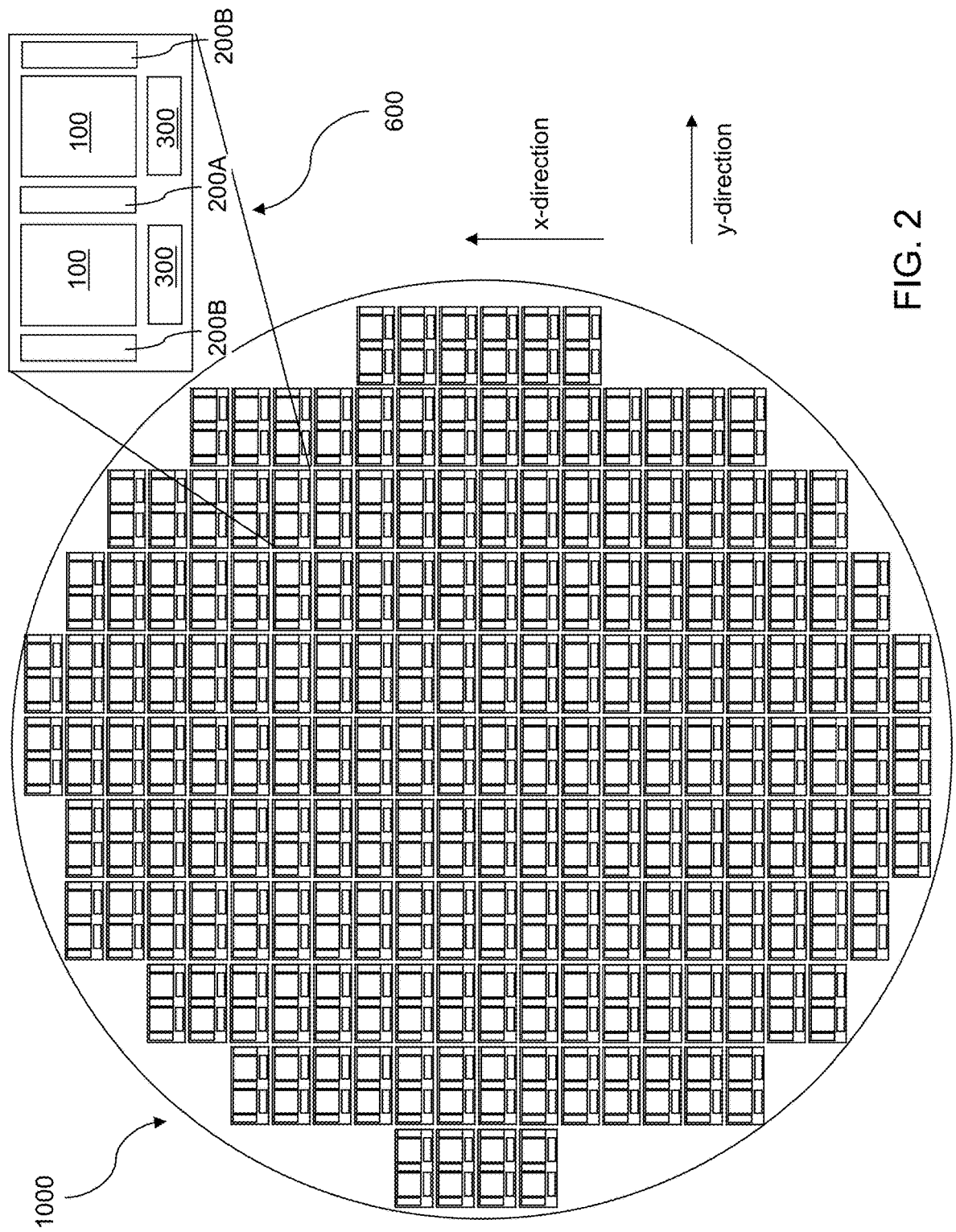
FIG. 2 is a top-down view of a substrate with a first exemplary array of in-process semiconductor dies that can be employed to implement various embodiments of the present disclosure.

Referring to FIG. 2, multiple instances of a semiconductor device, such as multiple instances of the three-dimensional memory device illustrated in FIGS. 1A and 1B, can be provided within a plurality of semiconductor dies 600 arranged in an array of columns and rows extending along the respective x and y directions. Various processing steps including deposition processes, lithographic patterning processes, and etch processes can be repeatedly performed to form the multiple instances of the three-dimensional memory device of FIGS. 1A and 1B.

The array of semiconductor dies 600 can have a first periodicity along a first horizontal direction (such as an x-direction) and a second periodicity along a second horizontal direction (such as a y-direction) within a horizontal plane that is parallel to a top surface of the semiconductor wafer 1000, which corresponds to the substrate (9, 10) shown in FIG. 1A. In other words, the first periodicity can be a minimum separation distance between identical patterns along the x-direction, and the second periodicity can be a minimum separation distance between identical patterns along the y-direction.

In one embodiment, each semiconductor die 600 can include at least one first image region 100 and at least one second image region (200A, 200B) having different pattern of structural components than the at least one first image region 100. In one embodiment, each semiconductor die 600 can include multiple first image regions 100 that are laterally spaced among one another by multiple second image regions (200A, 200B). In the illustrated example of FIG. 2, a semiconductor die 600 can include two first image regions 100, an inner second image region 200A located between the two first image regions 100, two outer second image regions 200B located outside of the two first image regions 100, and two third image regions 300. The inner second image region 200A and the outer second image regions 200B can include the same device pattern.

In one embodiment, each first image region 100 can include an instance of the memory array region (e.g., memory plane) 110 illustrated in FIGS. 1A and 1B, each second image region (200A, 200B) can include an instance of the contact region 210 and word line driver circuits, such as word line decoders, and each third image region 300 can include an instance of the peripheral device region 220, such as bit line driver circuits, such as sense amplifiers, etc., illustrated in FIGS. 1A and 1B. Thus, each first image region 100 can include one memory plane containing a two-dimensional array of memory stack structures 55 or in-process structures for forming the memory stack structures, and each second image region (200A, 200B) can include stepped surfaces (e.g., word line staircase) of an alternating stack (32, 46), contact via cavities, or contact via structures 86 depending on the processing step at which the semiconductor wafer 1000 is located into a lithographic exposure tool. Word line decoding semiconductor devices, commonly referred to as row decoders, can be formed in the second image regions (200A, 200B). In this case, each third image region 300 can include peripheral devices 700 and metal interconnect structures for forming sense amplifiers and connections to bit lines 98 that extend to the memory array regions 110, i.e., into the first image regions 100.

During various steps in the manufacturing process of the semiconductor wafer 1000, inspection of the semiconductor wafer 1000 may be undertaken to identify defects in the semiconductor wafer 1000. Detecting and locating defects on the semiconductor wafer 1000 during the manufacturing process can help avoid semiconductor device failure. Accordingly, information associated with defects, such as the defect depth position, is needed to assist in manufacturing process feedback.

Figure 3:
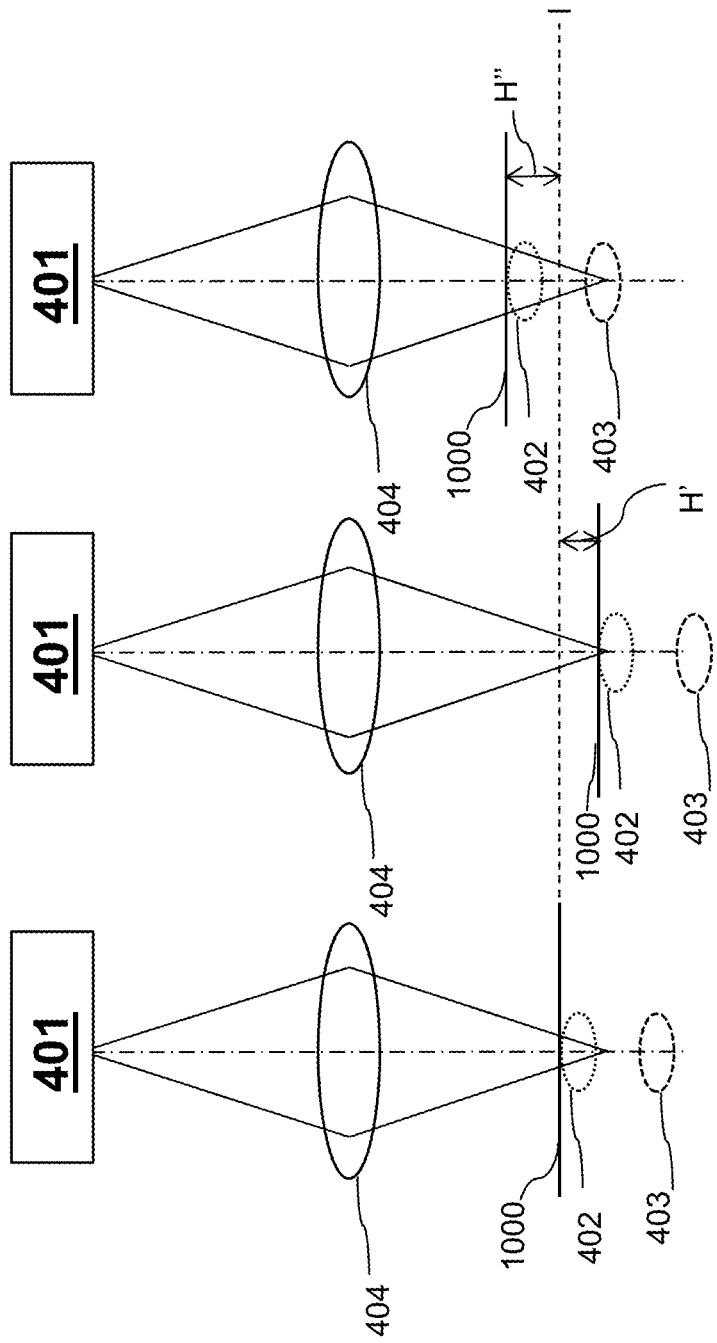
FIG. 3 is a component block diagram illustrating an example method of defect detection.

FIG. 3 illustrates one such example method of defect detection that may be utilized with a substrate containing solid state devices, such as the above described semiconductor wafer 1000. Other substrates and other devices may also be inspected using the method described herein. In order to obtain depth information on defects 402 and 403 in the substrate, such as the semiconductor wafer 1000, after wafer inspection, the semiconductor wafer 1000 is arranged under an objective lens 404 (also referred to as a focusing lens) focusing light on a sensor 401. The defects 402 and 403 are iteratively reviewed by varying the focus positions of the objective lens 404 relative to the surface of the semiconductor wafer 1000 by moving the semiconductor wafer 1000 closer and farther away from the objective lens 404. For example, after observing the semiconductor wafer 1000 at a first position of focus, the surface of the semiconductor wafer 1000 is moved away from the objective lens 404 a distance H' to a second focus position, and then the surface of the semiconductor wafer 1000 is moved toward the objective lens 404 past the first position a distance of H" to a third focus position. The movement of the semiconductor wafer 1000 may lead to finding the maximum intensities which may indicate the depth where defects are located. However this procedure imposes a large time requirement to image the semiconductor wafer 1000 at different focus depths and may require as much as 15 hours to identify 300 defects.

The embodiments of the present disclosure may provide a faster defect depth detection capability, such as providing defect depth measurement that takes less than 15 hours to identify 300 defects. For example, the various embodiments of the present disclosure may provide a defect depth detection capability that takes about 1 hour to identify 300 defects. The embodiments of the present disclosure are directed to inspection tools and methods that may provide defect depth measurement without requiring varying focus positions of lens or sensors, based at least in part on images generated by shifting parallax images using a light field camera.

Figure 4A:
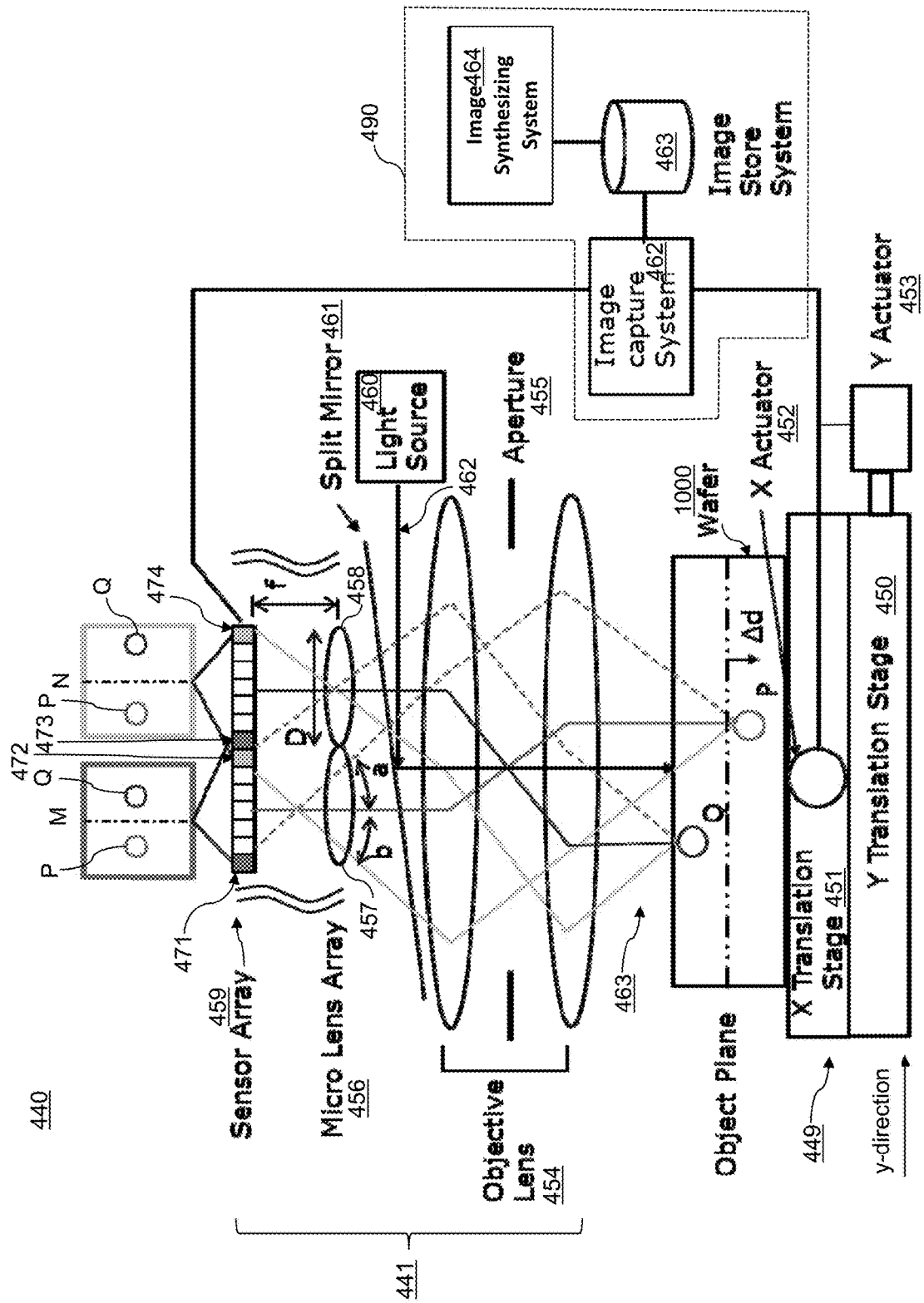
FIG. 4A is a schematic block diagram of a wafer inspection tool according to various embodiments of the present disclosure.
Figure 4B:
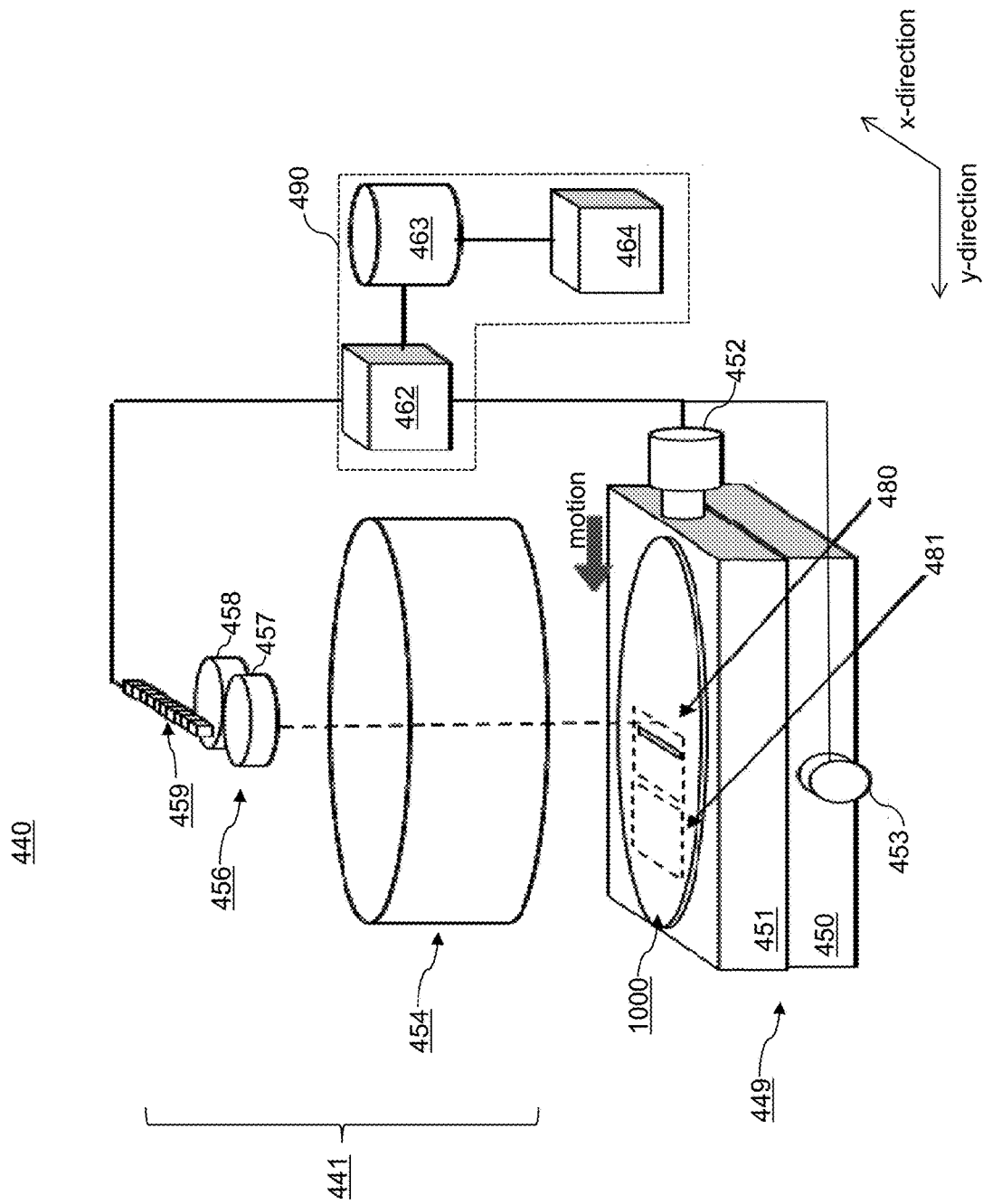
FIG. 4B is a three dimensional schematic block diagram of the embodiment wafer inspection tool of FIG. 4A.

FIGS. 4A and 4B illustrate an embodiment inspection tool 440, such as a wafer inspection tool. While the inspection tool may be used to inspect wafers, such as semiconductor wafers (e.g., silicon wafers), and is referred to as a "wafer inspection tool" below, the inspection tool may be used to inspect any suitable insulating, semiconductor or conductive substrates containing various micro-scale and/or nano-scale structures thereon. The wafer inspection tool 440 may include a light field camera 441 (also known as plenoptic camera) and a stage 449. The light field camera 441 may be a digital light field camera. The light field camera 441 captures information about the light field emanating from the device under test located on the stage 449. In other words, the light field camera 441 captures the intensity of light in a scene as well as the direction that the light rays are: tr ing in space. In contrast, a conventional camera records only light intensity. In one embodiment, the light field camera 441 uses a micro lens array 456 placed in front of an image sensor array 459 to sense intensity and directional information of radiation (e.g., infra-red radiation, etc.) rays emanating from the device under test located on the stage 449. The light field camera. 441 may include additional components.

As illustrated in FIGS. 4A and 4B, the inspection tool 440 includes an objective lens (e.g., one or more lenses) 454, the micro lens array 456, the sensor array 459, and an imaging controller 490. A substrate which can be a semiconductor wafer 1000 (e.g., substrate (9, 10) shown in FIGS. 1A and 1B), such as a silicon wafer, containing a completed or in-process device, such as a completed or in-process memory array region (e.g., memory plane) 110 illustrated in FIGS. 1A and 1B, can be loaded onto the stage 449. The semiconductor wafer 1000 may be supported on an upper surface of the stage 449. The stage 449 may be configured to provide a two-dimensional horizontal movement of the semiconductor wafer 1000 in the x-direction and y-direction. The two-dimensional horizontal movement may be in a plane parallel to the upper surface of the stage 449. The stage 449 may include two portions, a x translation stage 451 and a y translation stage 450 that may be respectively actuated by an x actuator 452 and a y actuator 453 to move the stage 449, and thereby the semiconductor wafer 1000, in the x-direction and/or y-direction. The stage 449 may be connected to the imaging controller 490, such as to an image capture system 462 of the imaging controller 490. The imaging controller 490 may be any type controller (e.g., a computer or dedicated control logic device or circuit, etc.). In various aspects, the imaging controller 490 may include one or more processors configured with processor-executable instructions to perform operations to monitor and control the state of the wafer inspection tool 440 and the various elements of the wafer inspection tool 440, as well as perform operations to generate images and detect/measure defects as described herein.

The objective lens 454 may be the main lens of the light field camera 441. The objective lens 454 may be supported in the inspection tool 440 above the upper surface of the stage 449 and thereby above the semiconductor wafer 1000 when it is supported on the upper surface of the stage 449. The objective lens 454 may comprise one or more optical lenses. The aperture 455 of the objective lens 454 may focus light from the semiconductor wafer 1000 toward the micro lens array 456 and sensor array 459. The micro lens array 456 may be supported in the wafer inspection tool 440 above the objective lens 454, such that the micro lens array 456 is disposed between the objective lens 454 and the micro sensor array 459. In this manner, the objective lens 454 may be disposed between the micro lens array 456 and the semiconductor wafer 1000 supported on the upper level of the stage 449. The micro lens array 456 may include two or more optical lenses, such as micro lens 457 and micro lens 458. A light source 460, such as a lamp or laser (not shown in FIG. 4B for ease of illustration) may output incident radiation (e.g., incident infra-red radiation) to a split mirror 461 that may reflect the incident radiation 462 onto the surface of the semiconductor wafer 1000 supported on the upper surface of the stage 449. Directional radiation rays, such as infra-red radiation rays 463 may be reflected from the semiconductor wafer 1000 in different directions through the objective lens 454, through the micro lens array 456, and onto the sensor array 459.

The sensor array 459 may include a series of photo sensor (i.e., solid state photodetector) pixels. For example, the series of photo sensor pixels may include individual photo sensor pixels 471, 472, 473, and 474. The photo sensor pixels of the sensor array 459, and thereby the sensor array 459, may be connected to the imaging controller 490. Specifically, the sensor array 459 may be connected to the image capture system 462 of the imaging controller 490. Via the image capture system 462, the imaging controller 490 may synchronize image capture by the sensor array 459 with translation of the semiconductor wafer 1000 via movement of the stage 449. The image capture system 462 of the imaging controller 490 may store images of the semiconductor wafer 1000 generated by the sensor array 459 in an image store system 463, such as a database, that may be part of the imaging controller 490. An image synthesizing system (e.g., a logic chip or a computer) 464 of the imaging controller 490 may retrieve images from the image store system 463 and may generate synthesized images by shifting the images. The imaging controller 490 may perform operations to detect defect depth positions in the semiconductor wafer 1000 based on the synthesized images generated by the image synthesizing system 464.

In the inspection tool 440, the micro lens array 456 may be set at the image plane (e.g., focal plane) of the objective lens 454. Each of the micro lenses 457 and 458 in the micro lens array 456 may have a smaller diameter "D" than the diameter of the objective lens 454. The sensor array 459 may be set at the focal point of the micro lens array 456. The distance between the sensor array 459 and micro lens array 456 may be equal to the focal length "f" of the micro lenses 457, 458 in the micro lens array 456. The micro lens array 456 may focus the directional light rays traveling in different directions from the semiconductor wafer 1000 to pixels in sensor array 459. The pixels in the sensor array 459 may be oriented over the micro lenses 457 and 458 in the micro lens array 456 such that one micro lens 457 corresponds to a first portion of the pixels in the sensor array 459 and the other micro lens 458 corresponds to a second portion of the pixels in the sensor array 459. In this manner, pixels over one micro lens 457, such as pixels running from pixel 471 to pixel 472, and pixels over the other micro lens 458, such as pixels running from pixel 473 to pixel 474, compose images of different detection angles which detect different light rays 463 traveling in different directions at different angles.

Picking up the left edge pixels under each micro lens, the image capture system 462 generates image of "M" of detection angle of "a". In the same way, image of "N" is obtained as detection angle of "b". These images M, N are generated by synchronizing sensor array 459 signal scan with stage 449 translation. The images M, N are stored in the image store system 463. Images of "M" and "N" are the same images that would be obtained by a stereo vision system, except that images M and N are obtained by a single sensor array of a light field camera 441. Defect "P" and "Q" are located at different depth in a device under test, such as in or over the semiconductor wafer 1000. The Y coordinate shift of defects "P" and "Q" between images "M" and "N" are different because of the different detection angle imparted by the different micro lenses 457, 458 of the micro lens array 456. As shown in FIG. 4B, the imaging controller 490 may control the stage 449 such that images of inspection area 480 and adjacent area 481 of the semiconductor wafer 1000 are obtained with image capture system 462. The inspection area 480 may correspond to one die 600 being inspected, while the adjacent area 481 may correspond to another die 600 shown in FIG. 2 located adjacent (e.g., next to) the die 600 being inspected. In a similar manner, the entire semiconductor wafer 1000 may be imaged by the imaging controller 490.

Figure 5A:
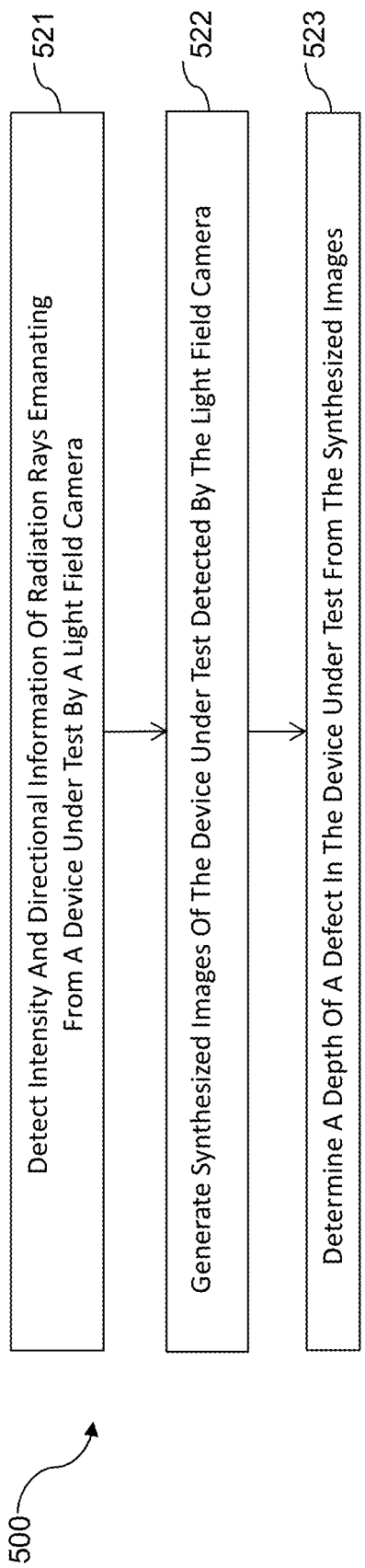

FIG. 5A illustrates an embodiment method 500 of inspecting a device under test, such as a semiconductor wafer 1000, for defects using the light field camera 441. In block 521, the light field camera 441 detects intensity and directional information of radiation rays emanating from a device under test 1000. In block 522 synthesized images of the device under test 100 detected by the light field camera 441 are generated (e.g., by the imaging controller 490). In block 523, a depth of a defect (e.g., P or Q) in the device under test 1000 is determined (e.g., by the imaging controller 490) from the synthesized images.

FIG. 5B illustrates a more detailed embodiment method 550 of inspecting a device under test, such as a semiconductor wafer for defects based at least in part on synthesized images. In various embodiments, the operations of method 550 may be performed by an optical inspection tool (e.g., wafer inspection tool 440) containing a light field camera 441, specifically the imaging controller of the wafer inspection tool 440 (e.g., the imaging controller 490 and its various systems, such as image capture system 462, image store system 463, and image synthesizing system 464).

In block 552, the imaging controller may generate images with different detection angles of an inspection area 480 of a device under test (e.g., semiconductor wafer 1000) by a sensor array 459 of the light field camera 441. In block 553, the imaging controller 490 may generate images with different detection angles of an adjacent area 481 of the device under test (e.g., semiconductor wafer 1000) by the sensor array 459.

In block 554, the imaging controller 490 may detect potential defects in the images of the inspection area. For example, FIG. 4A shows example images M and N of the inspection area 480 with defects P and Q detected in the images M and N.

In block 555, the imaging controller may, for each detected potential defect, generate a synthesized (i.e., synthetic) image of the inspection area focused at the respective detected potential defect using the images with different detection angles of the inspection area. For example, FIGS. 6A and 6B illustrate refocused images generated by an image synthesizing system 464 of an imaging controller 490. Image "N" from FIG. 4A is shown in FIG. 6A shifted to image "M" by Δx1 and superimposed over image "M". As a result, the synthesized image 502 of FIG. 6A is focused on defect "P" is generated. In a similar manner, by shifting image "N" from FIG. 4A by Δx2 and superimposing it over image "M", synthesized image 503 focused on defect "Q" is generated as shown in FIG. 6B. The shifting amount of Δx is correlated to a depth Δd of defect as follows: Δd=K*D*f/Δx, where K is a coefficient, D is the diameter of the micro-lens, and f is the focal length of the micro-lens.

In block 556, the imaging controller 490 may generate a synthesized image of the adjacent area 481 using the images with different detection angles of the adjacent area. In block 557, the imaging controller may, for each detected potential defect (e.g., P or Q), generate a subtracted image of the potential defect by subtracting the synthesized image of the adjacent area 481 from the synthesized image of the inspection area 480 focused at the respective detected potential defect. For example, FIG. 6C shows that each synthesized adjacent area 481 image 505, 506 may be subtracted from its respective synthesized inspection area 480 image 503, 502 to generate a new respective subtracted image 507, 508. In this manner, each synthesized inspection area image correlated to Δd with Δx may be reduced by subtracting the synthesized adjacent area image to generate a new subtracted image 507, 508, etc.

In block 558, the imaging controller may determine defect areas corresponding to detected potential defects above a preset threshold from all subtracted images. For example, as illustrated in FIG. 6C, subtracted image 507 may be focused on defect Q and subtracted image 508 may be focused on defect P. In block 559, the imaging controller may determine maximum defect intensities for all determined defect areas and assign a depth to each defect area based on that defect area's maximum intensity. For example, as illustrated in FIG. 6C defect areas Q and P may be detected and the maximum intensities 509, 510 in the defect areas Q and P are recorded for all the subtracted images 507, 508. By detecting the maximum defect intensities from the series of subtracted images, the depths are assigned to the defects. Thus, the depth Δd of the detected defects (i.e., the vertical location of the detected defects in or over the semiconductor wafer 1000) is determined. In this manner, defect depths may be measured only by wafer scan without the step of reviewing by varying focus depths as in the conventional process.

Figure 7:
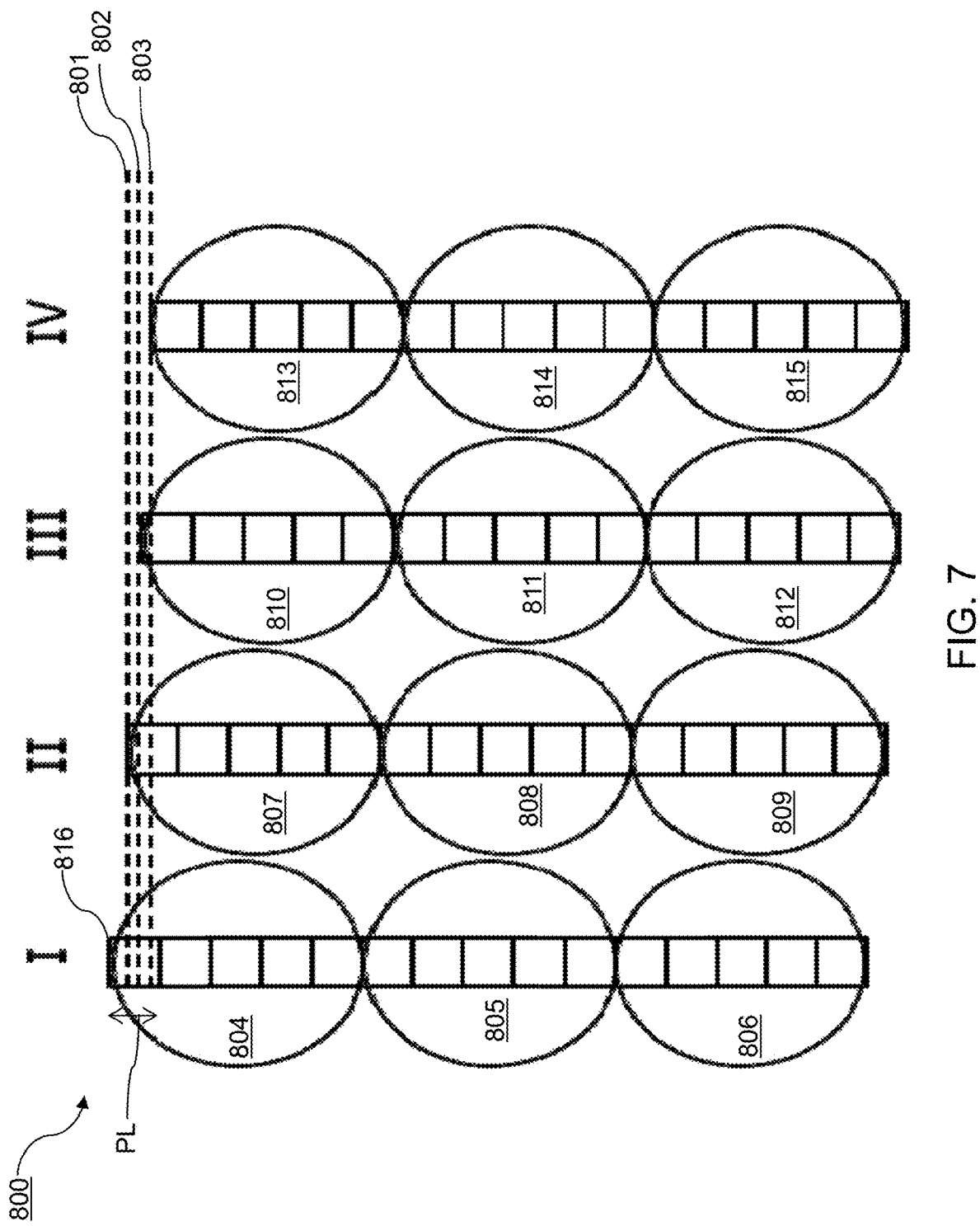
FIG. 7 is a component block diagram of a multiple sensor array and multiple micro lens sensor element according to various embodiments of the present disclosure.

To improve the spatial resolution of a wafer inspection tool, in various embodiments, additional micro lens arrays and sensor arrays may be added. FIG. 7 is a component block diagram of a multiple sensor array and multiple micro lens sensor element 800 according to various embodiments. The sensor element 800 includes a series of separate sensor arrays, such as sensor arrays I, II, III, and IV. Each of the sensor arrays I, II, III, and IV may be similar to sensor array 459 described above. The sensor element 800 may include micro lens arrays corresponding to each sensor array I, II, III, and IV. For example, a micro lens array with micro lenses 804, 805, 806 may be disposed beneath sensor array I. A micro lens array with micro lenses 807, 808, 809 may be disposed beneath sensor array II. A micro lens array with micro lenses 810, 811, 812 may be disposed beneath sensor array III. A micro lens array with micro lenses 813, 814, 815 may be disposed beneath sensor array IV. The various micro lens arrays corresponding to sensor arrays I, II, III, and IV as illustrated in FIG. 7 may be similar to micro lens array 456 described above. In the sensor element 800, each pixel of the sensor arrays I, II, III, and IV may have a same pixel length "PL". An edge 801, 802, and 803 of each sensor array II, III, and IV may be offset from the edge 816 of the sensor array I. In this manner, sensor arrays I, II, III, IV may be staggered in the sensor element 800. In various embodiments, the total offset from the sensor arrays II, III, and IV from the sensor array I may be less than the pixel length "PL". For example, the edge 801 of sensor array II may be offset a quarter pixel (i.e., ¼ of PL) from the edge 816 of sensor array I. The edge 802 of the sensor array III may be offset a quarter pixel (i.e., ¼ of PL) from the edge 801 of the sensor array II (accordingly ½ of PL from the edge 816 of sensor array I). The edge 803 of the sensor array IV may be offset a quarter pixel (i.e., ¼ of PL) from the edge 802 of the sensor array III (accordingly ¾ of PL from the edge 816 of sensor array I). In this manner, all the sensor arrays II, III, and IV are shifted from the sensor array I by a sub-pixel.

Figure 8:
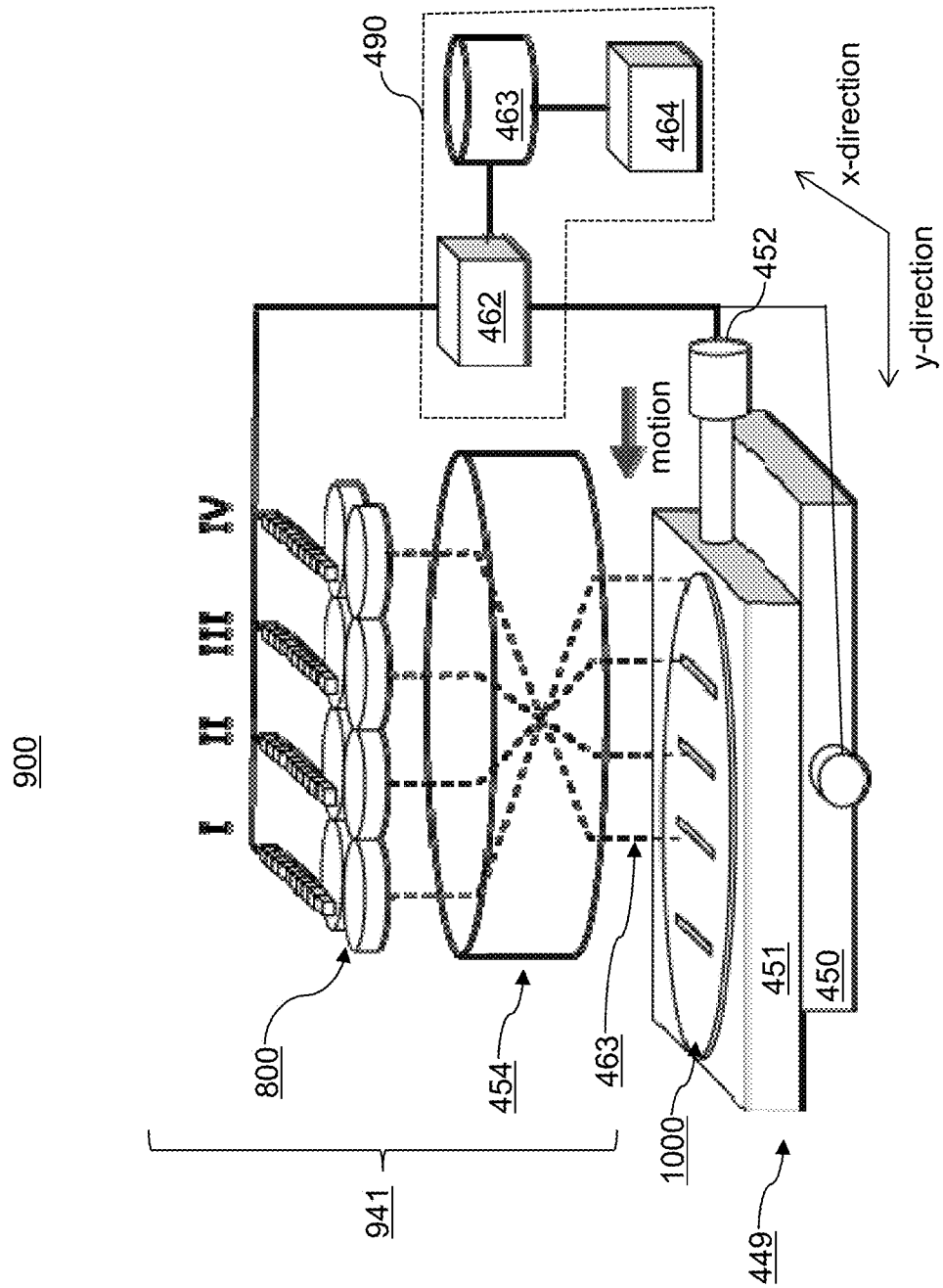
FIG. 8 is a three dimensional schematic block diagram of a wafer inspection tool according to various embodiments of the present disclosure.

FIG. 8 illustrates an embodiment optical inspection tool 900 including the light field camera 941 containing the sensor element 800. The wafer inspection tool 900 may be similar to wafer inspection tool 440, except the single micro lens array 456 and single sensor array 459 may be replaced with the sensor element 800 having multiple sensor arrays I, II, III, and IV and multiple micro lens arrays. The multiple sensor arrays I, II, III, and IV of sensor element 800 may be connected to the imaging controller 490 and image capture system 462.

Figure 9:
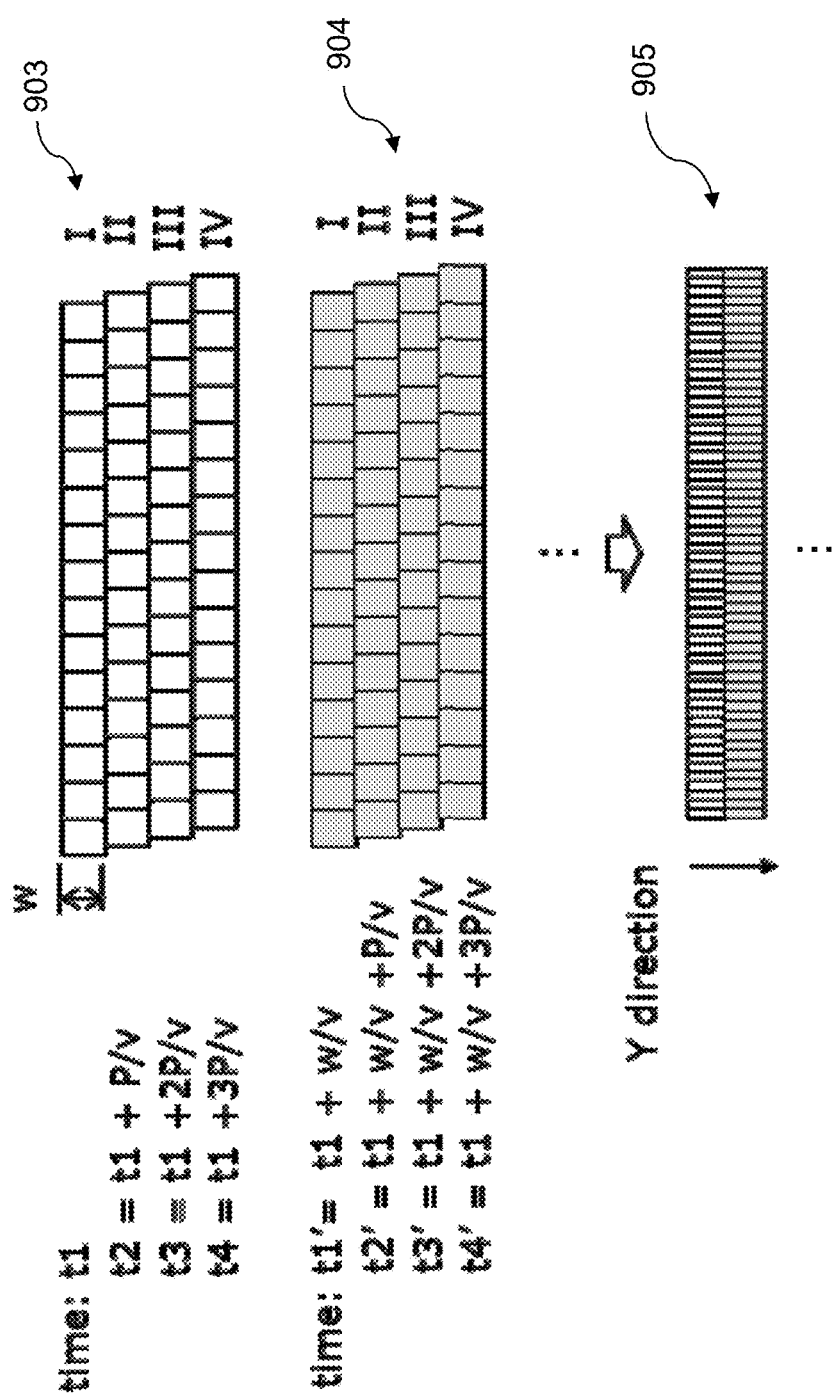
FIG. 9 is a block diagram illustrating operations to combine sets of images from different offset sensor arrays into super resolution images.

The sensor element 800 permits the inspection tool 900 to generate super resolution images, such as those shown in FIG. 9. The four sensor arrays I, II, III, and IV may capture a series of images 903 of an area of the semiconductor wafer 1000 at times t1, t2, t3 and t4, where t2=t1+P/v, t3=t1+2P/v, and t4=t1+3P/v, in which P is a distance between arrays I and II, II and III, III and IV, and v is stage 449 velocity. Each image 903 should be taken at the same position of the semiconductor wafer 1000. The four sensor arrays I, II, III, and IV may also capture a series of images 904 of an area of the semiconductor wafer 1000 at times t1', t2', t3' and t4', where t1'=t1+w/v, t2'=t1+w/v+P/v, t3'=t1+w/v+2P/v, t4'=t1+w/v+3P/v, in which w is the pixel width in y direction. All the images 903, 904 from the four sensor arrays I, II, III, and IV at the times t1 through t4 and t1' through t4' may be combined into a new image 905 that may be a super resolution image. In this manner, spatial resolution may be achieved by using the sensor element 800.

Thus, as shown in FIGS. 4A, 4B and 8, in one embodiment, an optical inspection tool 440 or 900 includes a stage 449 configured to support a device under test 1000 on its upper surface and to move the supported device under test in a plane parallel to the upper surface, a light field camera 441 or 941, and an imaging controller 490 connected wirelessly or by a wire to the stage and the light field camera. The imaging controller 490 is configured to generate synthesized images 502 and 503 of the device under test 1000 detected by the light field camera 441 or 941, and to determine a depth of a defect P or Q in the device under test 1000 from the synthesized images.

In one embodiment, the imaging controller 490 is further configured to generate the synthesized images by shifting parallax images by an amount corresponding to the depth of the defect, superimpose the synthesized images over one another, subtract a synthesized image of an adjacent area from a synthesized image of an inspection area of the device under test to form subtracted synthesized image, find a maximum intensity from the subtracted synthesized image; and assign a depth position to the defect from the maximum intensity.

As described above with respect to FIGS. 4A, 4B, 7 and 8, the optical camera 441 or 941 comprises an objective lens 454, a first micro lens array (e.g., 456 in FIG. 4A or 804-806 in FIG. 7), wherein each lens (e.g., 457, 458 in FIG. 4A) of the first micro lens array has a smaller diameter than that of the objective lens 454, and a first sensor array (e.g., 459 in FIG. 4A or I in FIGS. 7 and 8) comprises a first series of photo sensor pixels (e.g., 471-474 in FIG. 4A). The objective lens is disposed between the upper surface and the first micro lens array, the first micro lens array is disposed between the first sensor array and the objective lens at an image plane of the objective lens, the first sensor array is disposed at a focal point of the first micro lens array such that first micro lens array is configured to focus light to the first series of photo sensor pixels to generate images of an area of device under test with different detection angles.

In the embodiment illustrated in FIGS. 7 and 8, the optical inspection tool 900 also includes two or more additional micro lens arrays 807-809 and 810-812 in which each micro lens 807-812 of each additional micro lens array has a smaller diameter than that of the objective lens 854, and two or more additional sensor arrays II and III, corresponding to a respective one of the two or more additional micro lens arrays 807-809 and 810-812, respectively.

In one embodiment, each of the two or more additional sensor arrays II and III comprises its own set of photo sensor pixels, each additional micro lens array 807-808 and 810-812 is disposed between its respective corresponding additional sensor array II and III and the objective lens 454 at the image plane of the objective lens. Each additional sensor array II and III is at a focal point of its respective corresponding additional micro lens array 807-809 and 810-812 such that its respective corresponding additional micro lens array focuses light to that additional sensor array with different detection angles. The imaging controller 490 is connected wirelessly or by a wire to each of the additional sensor arrays II and III.

In the embodiment described above with respect to FIG. 7, the photo sensor pixels in all sensor arrays I-IV have a same pixel length PL and the two or more additional sensor arrays II and III are each offset from the first sensor array I and each offset from one another a distance less than the pixel length PL. In one embodiment, the two or more additional micro lens arrays are three additional micro lens arrays 807-809, 810-812 and 813-815 and the two or more additional sensor arrays are three additional sensor arrays II, III and IV.

Control elements or controllers may be implemented using computing devices (such as computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of inspecting a device under test for defects, comprising:
   detecting intensity and directional information of radiation rays emanating from a device under test by a light field camera;
   generating synthesized images of the device under test detected by the light field camera; and
   determining a depth of a defect in the device under test from the synthesized images;
   wherein:
   a step of detecting intensity and directional information of radiation rays comprises detecting the intensity and the directional information of the radiation rays with different detection angles by a plurality of sensor arrays each comprising a respective series of photo sensor pixels, the synthesized images resulting from light focused on the plurality of sensor arrays by a respective micro lens array for each sensor array and an objective lens;
   the photo sensor pixels in the plurality of sensor arrays have a same pixel length;
   a second sensor array of the plurality of sensor arrays is offset from a first sensor array of the plurality of sensor arrays by a distance less than the pixel length; and
   a third sensor array of the plurality of sensor arrays is offset from the first and the second sensor arrays of the plurality of sensor arrays by a distance less than the pixel length.

2. An optical inspection tool, comprising:
   a stage configured to support a device under test on its upper surface and to move the device under test in a plane parallel to the upper surface;
   a light field camera; and
   an imaging controller connected wirelessly or by a wire to the stage and the light field camera, wherein the imaging controller is configured to generate synthesized images of the device under test detected by the light field camera, and determine a depth of a defect in the device under test from the synthesized images;
   wherein the light field camera comprises:

an objective lens;

a first micro lens array, wherein each lens of the first micro lens array has a smaller diameter than that of the objective lens;

a first sensor array comprising a first series of photo sensor pixels, wherein:

the objective lens is disposed between the upper surface and the first micro lens array;

the first micro lens array is disposed between the first sensor array and the objective lens at an image plane of the objective lens; and the first sensor array is disposed at a focal point of the first micro lens array such that first micro lens array is configured to focus light to the first series of photo sensor pixels to generate images of an area of device under test with different detection angles;

further comprising:

two or more additional micro lens arrays, wherein each micro lens of each additional micro lens array has a smaller diameter than that of the objective lens; and two or more additional sensor arrays, each of the two or more additional sensor arrays corresponding to a respective one of the two or more additional micro lens arrays;

wherein:

each of the two or more additional sensor arrays comprises its own set of photo sensor pixels;

each additional micro lens array is disposed between its respective corresponding additional sensor array and the objective lens at the image plane of the objective lens;

each additional sensor array is at a focal point of its respective corresponding additional micro lens array such that its respective corresponding additional micro lens array focuses light to that additional sensor array with different detection angles;

the imaging controller is connected wirelessly or by a wire to each of the additional sensor arrays;

the photo sensor pixels in all sensor arrays have a same pixel length; and the two or more additional sensor arrays are each offset from the first sensor array and each offset from one another a distance less than the pixel length.

3. The optical inspection tool of claim 2, wherein the two or more additional micro lens arrays arc comprise three additional micro lens arrays and the two or more additional sensor arrays comprise three additional sensor arrays.

* * * * *